(12) United States Patent
Kato et al.

(10) Patent No.: US 11,183,483 B2
(45) Date of Patent: Nov. 23, 2021

(54) MULTICHIP MODULE AND ELECTRONIC DEVICE

(71) Applicant: MITSUBISHI HEAVY INDUSTRIES, LTD., Tokyo (JP)

(72) Inventors: Masahiro Kato, Tokyo (JP); Shuhei Iriyama, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 16/792,978

(22) Filed: Feb. 18, 2020

(65) Prior Publication Data
US 2020/0273845 A1    Aug. 27, 2020

(30) Foreign Application Priority Data

Feb. 22, 2019    (JP) .............................. JP2019-030551

(51) Int. Cl.
*H01L 23/48*    (2006.01)
*H01L 23/04*    (2006.01)
(Continued)

(52) U.S. Cl.
CPC ........ *H01L 25/0657* (2013.01); *H01L 21/486* (2013.01); *H01L 21/4853* (2013.01);
(Continued)

(58) Field of Classification Search
CPC ........... H01L 25/0657; H01L 23/49833; H01L 24/16; H01L 23/49827; H01L 23/147;
(Continued)

(56) References Cited

U.S. PATENT DOCUMENTS 7,989,707 B2 *   8/2011   Yamano .................. H01L 24/97
                                                                174/260
2004/0238935 A1   12/2004  Yoshimura
(Continued)

FOREIGN PATENT DOCUMENTS

JP    2003-110091    4/2003
JP    2011-199673    10/2011
(Continued)

*Primary Examiner* — Shouxiang Hu
(74) *Attorney, Agent, or Firm* — Wenderoth, Lind & Ponack, L.L.P.

(57) ABSTRACT

A multichip module provided with a first substrate, a first semiconductor chip, a second substrate and a third substrate. The first semiconductor chip has a first surface provided with a first electrode and a second surface mounted on the first substrate so that the first wiring of a first mount surface of the first substrate is electrically connected to the first electrode. The second substrate has a second mounting surface and a third mounting surface bonded to the first substrate so that the second mounting surface is opposed to the first mounting surface. The third substrate has a fourth mounting surface provided with a second wiring and a fifth mounting surface bonded to the second silicon substrate so that the fourth mounting surface is opposed to the third mounting surface and is mounted with the first semiconductor chip so that the second wiring is electrically connected to the second surface.

8 Claims, 12 Drawing Sheets

(51) Int. Cl.
*H01L 25/065* (2006.01)
*H01L 23/498* (2006.01)
*H01L 23/00* (2006.01)
*H01L 23/14* (2006.01)
*H01L 21/48* (2006.01)
*H01L 23/538* (2006.01)

(52) U.S. Cl.
CPC ...... *H01L 23/147* (2013.01); *H01L 23/49827* (2013.01); *H01L 23/49833* (2013.01); *H01L 23/49838* (2013.01); *H01L 23/5389* (2013.01); *H01L 24/16* (2013.01); *H01L 24/81* (2013.01); *H01L 24/17* (2013.01); *H01L 24/32* (2013.01); *H01L 24/33* (2013.01); *H01L 24/73* (2013.01); *H01L 2224/16225* (2013.01); *H01L 2224/17181* (2013.01); *H01L 2224/33181* (2013.01); *H01L 2224/73204* (2013.01); *H01L 2224/73253* (2013.01); *H01L 2224/81192* (2013.01); *H01L 2225/06517* (2013.01); *H01L 2225/06548* (2013.01); *H01L 2225/06572* (2013.01)

(58) Field of Classification Search
CPC ... H01L 24/81; H01L 21/486; H01L 21/4853; H01L 23/49838; H01L 2225/06572; H01L 2224/16225; H01L 24/73; H01L 24/32; H01L 24/17; H01L 24/33; H01L 25/50; H01L 23/5389; H01L 23/5385; H01L 23/5384; H01L 23/13; H01L 23/481; H01L 25/0652
See application file for complete search history.

(56) References Cited

U.S. PATENT DOCUMENTS

| | | | |
|---|---|---|---|
| 2005/0146049 A1* | 7/2005 | Kripesh | H01L 23/49827 257/776 |
| 2006/0216857 A1 | 9/2006 | Zhao | |
| 2009/0212407 A1 | 8/2009 | Foster et al. | |
| 2009/0316373 A1* | 12/2009 | Kim | H05K 1/185 361/764 |
| 2011/0226731 A1 | 9/2011 | Funabiki et al. | |
| 2017/0025383 A1 | 1/2017 | Kato et al. | |
| 2018/0082973 A1 | 3/2018 | Kato et al. | |

FOREIGN PATENT DOCUMENTS

| | | |
|---|---|---|
| JP | 2016-164950 | 9/2016 |
| WO | 2015/136998 | 9/2015 |

* cited by examiner

F I G. 5
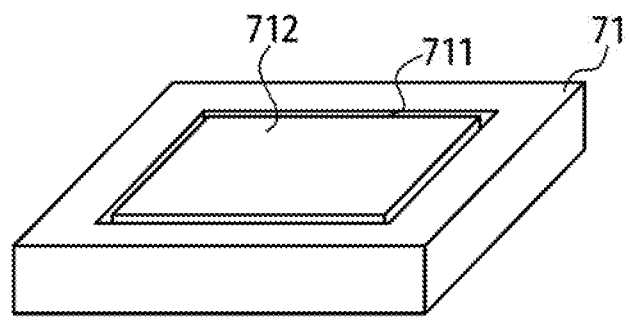

MULTICHIP MODULE AND ELECTRONIC DEVICE

TECHNICAL FIELD

The present invention relates to a multichip module, an electronic device and a manufacturing method of a multichip module and is suitable to be used in a multichip module in which a plurality of semiconductor chips are stacked and mounted in their thickness direction, an electronic device using this multichip module and a manufacturing method of this multichip module, for example.

BACKGROUND ART

Higher functionality, higher performance, smaller size and lighter weight are required for small artificial satellites and the like, by maintaining their sizes. Further downsizing and densification are needed for electronic devices such as computers mounted on artificial satellites; in other words, higher density of functions is needed. In addition, such demands are arising in fields other than artificial satellites as well.

In relation with the above, there are disclosures related to a manufacturing method of interconnection devices that are infinitely stackable in patent literature 4 (US 2009/212407 A1). This manufacturing method includes following steps. In a first step, a substrate is formed from a single wafer having a first surface and a second surface opposed thereto. In a second step, a concave area with sizes to receive at least one die included to a stacked body is formed to the substrate. In a third step, at least one via that penetrates through the substrate from the first surface to the second surface is formed. In a fourth step, a conductive via is formed by at least partially filling the via with conductive material. In a fifth step, at least one first connection pad electrically connected to the conductive via is formed on the first surface. In a sixth step, at least one second connection pad electrically connected to the conductive via is formed on the second surface. In a seventh step, at least one rewiring trace connected to at least one connection pad is formed to one of the surfaces of the substrate. In an eighth step, a packaging subsystem is formed by mounting a die on a substrate electrically connected to the first connection pad or the second connection pad. In a ninth step, the packaging subsystem is singulated by dicing or other means. In a tenth step, a stacked body is formed by mounting the packaged subsystem on at least one subsequent packaging system.

CITATION LIST

Patent Literature

[Patent Literature 1] JP 2003-110091 A
[Patent Literature 2] US 2004/238935 A1
[Patent Literature 3] US 2006/216857 A1
[Patent Literature 4] US 2009/212407 A1
[Patent Literature 5] JP 2011-199673 A
[Patent Literature 6] US 2011/226731 A1
[Patent Literature 7] WO 2015/136998 A1
[Patent Literature 8] JP 2016-164950 A

SUMMARY OF THE INVENTION

Problem to be Solved by the Invention

Providing a multichip module able to mount a semiconductor chip that needs to be electrically grounded on a back-surface opposed to a front-surface on which a signal electrode is configured to a multilayer board so as to be electrically conductive. Other problems and new features will be obvious from disclosure of the present description and attached drawings.

Means for Solving the Problem

Means for solving the problem will be explained below by use of symbols used in "Description of the Embodiments". Those symbols are added in order to clarify relationships between description of "Claims" and "Description of the Embodiments". However, those symbols are not to be used in interpretation of the technical scope of the invention described in "Claims".

According to an embodiment, a multichip module (1) is provided with a first substrate (20A), a first semiconductor chip (10A), a second substrate (20B), a third substrate (20C) and a second semiconductor chip (10B). Herein, the first substrate (20A) has a first mounting surface provided with a first wiring (24A). The first semiconductor chip (10A) has a first surface provided with a first electrode (150A) and a second surface opposed to the first surface and is mounted on the first substrate (20A) so that the first wiring (24A) and the first electrode (150A) are electrically connected. The second substrate (20B) has a second mounting surface and a third mounting surface opposed to the second mounting surface and is bonded to the first substrate (20A) so that the second mounting surface is opposed to the first mounting surface. The third substrate (20C) has a fourth mounting surface provided with a second wiring (25C) and a fifth mounting surface opposed to the fourth mounting surface, is bonded to the second substrate (20B) so that the fourth mounting surface is opposed to the third mounting surface and is mounted with the first semiconductor chip (10A) so that the second wiring (25C) is electrically connected to the second surface and an electric potential of the second surface stabilizes. The second semiconductor chip (10B) has a third surface and is mounted on the third substrate (20C) so that the third surface is opposed to the fifth mounting surface.

According to an embodiment, an electronic device (100) is provided with a multichip module (1) and a substrate (62) that mounts the multichip module (1). The multichip module (1) is provided with a first substrate (20A), a first semiconductor chip (10A), a second substrate (20B), a third substrate (20C) and a second semiconductor chip (10B). Herein, the first substrate (20A) has a first mounting surface provided with a first wiring (24A). The first semiconductor chip (10A) has a first surface provided with a first electrode (150A) and a second surface opposed to the first surface and is mounted on the first substrate (20A) so that the first wiring (24A) and the first electrode (150A) are electrically connected. The second substrate (20B) has a second mounting surface and a third mounting surface opposed to the second mounting surface and is bonded to the first substrate (20A) so that the second mounting surface is opposed to the first mounting surface. The third substrate (20C) has a fourth mounting surface provided with a second wiring (25C) and a fifth mounting surface opposed to the fourth mounting surface, is bonded to the second substrate (20B) so that the fourth mounting surface is opposed to the third mounting surface and is mounted with the first semiconductor chip (10A) so that the second wiring (25C) is electrically connected to the second surface and an electrical potential of the second surface stabilizes. The second semiconductor chip (10B) has a third surface and is mounted on the third substrate (20C) so that the third surface is opposed to the fifth mounting surface.

According to an embodiment, a manufacturing method of a multichip module (1) includes: mounting (S08) a first semiconductor chip (10A), that has a first surface provided with a first electrode (150A) and a second surface opposed to the first surface, on a first substrate (20A) having a first mounting surface provided with a first wiring (24A), so that the first wiring (24A) and the first electrode (150A) are electrically connected; bonding (S10) a second substrate (20B), that has a second mounting surface and a third mounting surface opposed to the second mounting surface, on the first substrate (20A), so that the second mounting surface is opposed to the first mounting surface; and bonding (S11) a third substrate (20C), that has a fourth mounting surface and a fifth mounting surface opposed to the fourth mounting surface, to the second substrate (20B), so that the fourth mounting surface is opposed to the third mounting surface. The bonding (S11) the third substrate (20C) to the second substrate (20B) includes carrying out mounting the first semiconductor chip (10A) on the third substrate (20C) so that the second surface is electrically connected to a second wiring (25C) provided to the fourth mounting surface and an electrical potential of the second surface stabilizes, simultaneously to the bonding the third substrate (20C) to the second substrate (20B).

Effects of the Invention

According to the above described embodiment, a semiconductor chip that needs to be electrically grounded on a back-surface opposed to a front-surface on which a signal electrode is configured can be mounted on a multichip module.

BRIEF DESCRIPTION OF DRAWINGS

FIG. 5 is a perspective view showing a configuration example of a silicon substrate with a frame-shaped through hole formed thereto.

DESCRIPTION OF EMBODIMENTS

Embodiments of a multichip module, an electronic device and a manufacturing method of a multichip module according to the present invention will be described below with reference to attached drawings.

First Embodiment

Each of a plurality of semiconductor chips to be stacked in thickness direction is flip-chip-mounted on a multichip module according to a related art. For example, in a case of a multichip module according to a patent literature 7 (WO 2015/136998 A1), a plurality of semiconductor substrates on each of which a semiconductor chip is connected by flip chip bonding are stacked through semiconductor substrates that are arranged so as to surround semiconductor chips. In other words, if all electrodes that a semiconductor chip has are formed on a same surface of this semiconductor chip, the semiconductor chip can be mounted on the multichip module according to the above related art.

On the other hand, there is also a semiconductor chip that uses each of both surfaces by electrically connecting to any one of wirings. As an example of such a semiconductor, there is a semiconductor chip called Silicon On Insulator (SOI). A SOI type semiconductor chip is formed with a group of electrodes for signal on a first surface while it is necessary to stabilize an electric potential of a second surface opposed to the first surface by connecting to ground for example. To mount such a semiconductor chip on the multichip module according to the above related art, the group of electrodes on the first surface can be similarly connected by flip chip bonding on one hand; however, on the other hand, it is difficult to ground the second surface. As an example, it can be considered that it is difficult to be compatible with a downsizing of the multichip module. That is, to connect a second surface of a semiconductor chip on a semiconductor substrate mounted with a first surface of the semiconductor chip by a common wire bonding, it is necessary to keep spaces in both of a stacking direction of the multichip module and a horizontal direction parallel to the surfaces of the semiconductor substrate in order to arrange bonding wires. In addition, as another example, it is very difficult or impossible to connect the second surface of the semiconductor substrate to a semiconductor substrate opposed to this second surface by bonding wires for reasons related to structure of the multichip module.

Figure 1:
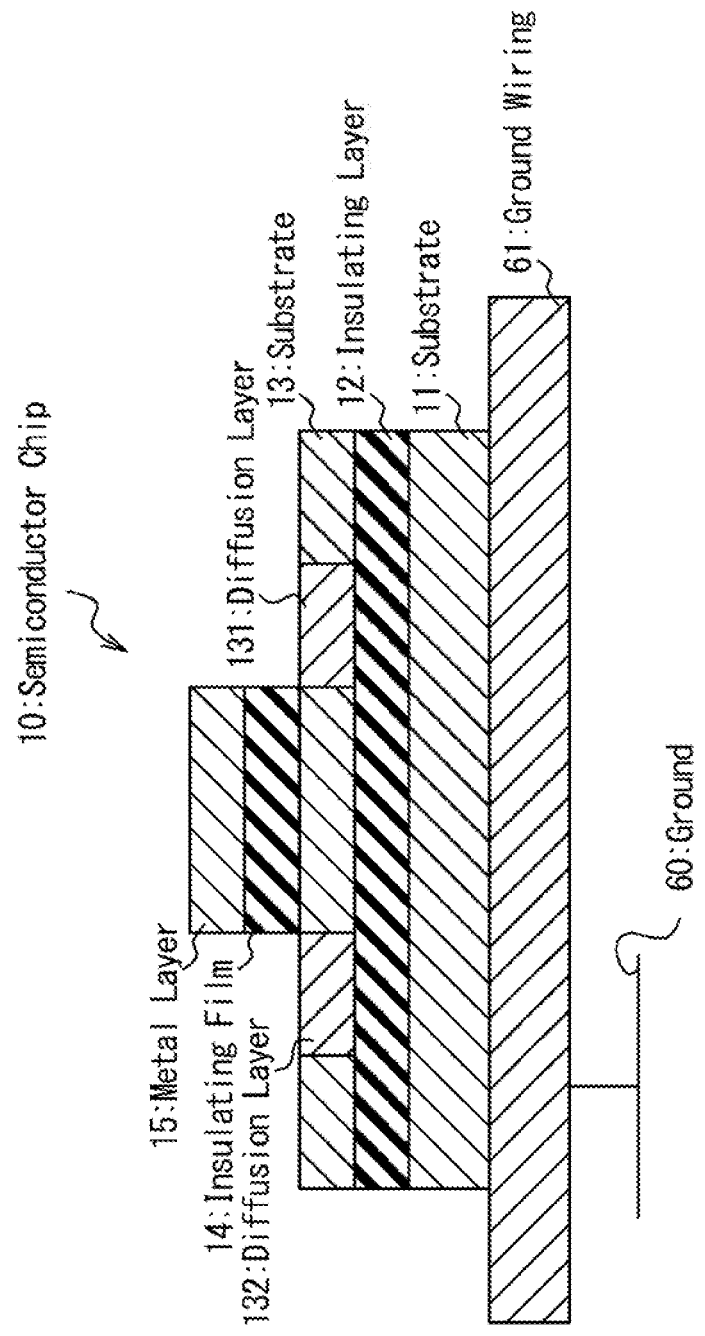
FIG. 1 is a cross-sectional view showing a configuration example of a semiconductor chip according to an embodiment.

FIG. 1 is a cross-sectional view showing a configuration example of a semiconductor chip 10 according to an embodiment. The semiconductor chip 10 in FIG. 1 has a SOI type structure and has electrodes on both surfaces thereof.

The semiconductor chip 10 in FIG. 1 is provided with a first substrate 11, an insulating layer 12, a second substrate 13, a first diffusion layer 131, a second diffusion layer 132, an insulating film 14 and a metal layer 15.

The first substrate 11, the insulation layer 12, the second substrate 13, the insulation film 14 and the metal layer 15 are stacked in this order. The first diffusion layer 131 and the second diffusion layer 132 are formed as parts of the second substrate 13.

In the semiconductor chip 10 in FIG. 1, the first substrate 11 is insulated by the insulating layer 12 from other parts. For this reason, an electric potential of the first substrate 11 is unstable, and as a result, operations of the semiconductor chip 10 may become unstable. In such a case, in order to stabilize operations of the semiconductor chip 10, the electric potential of the first substrate 11 may be stabilized by electrically connecting the first substrate 11 to ground wiring 61 grounded to a ground 60, for example.

At that time, the first substrate 11 may be used as a ground electrode connected to the ground 60 via the ground wiring 61. It should be noted that, in general, the semiconductor 10 has a plurality of electrodes to be used in original operations thereof. Those electrodes include a gate electrode connected to the metal layer 15, a drain electrode or a source electrode connected to the first diffusion layer 131 of the second diffusion layer 132, and the like, for example. In the following, electrodes other than ground electrodes that the semiconductor 10 has will be referred to as signal electrodes, for convenience. In this example, signal electrodes such as the gate electrode, the drain electrode and the source electrode are formed, in general, on another surface of the semiconductor 10 opposed to the surface on which ground electrodes are formed.

Figure 2A:
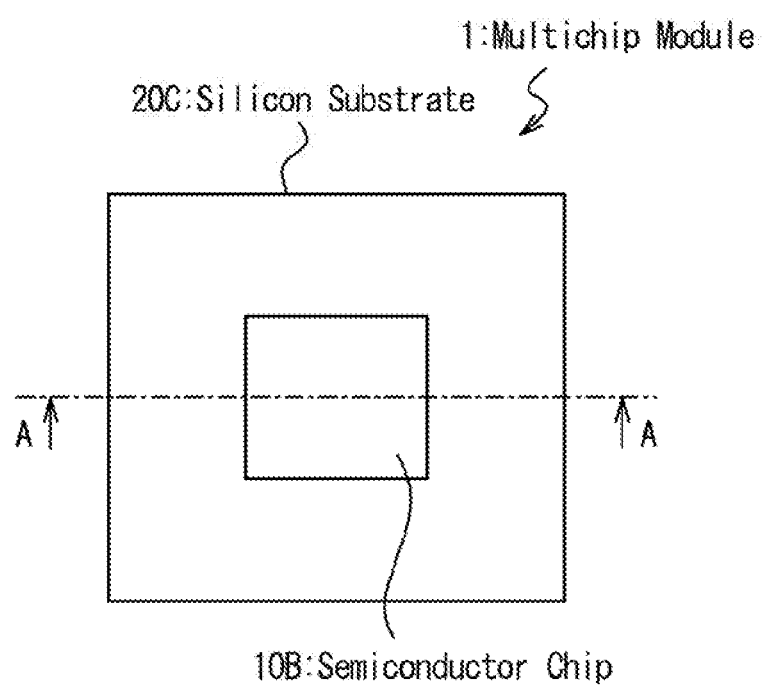
FIG. 2A is a top view showing a configuration example of a multichip module according to an embodiment.
Figure 2B:
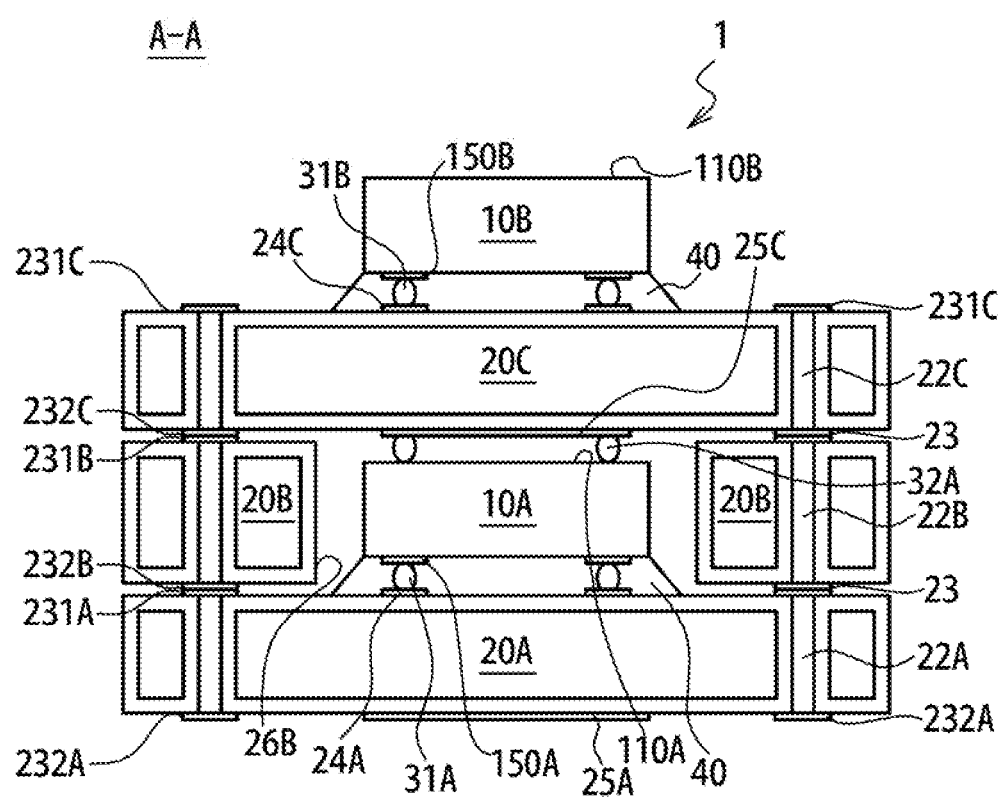
FIG. 2B is a schematic cross-sectional view by section line A-A showing a configuration example of the multichip module in FIG. 2A.

A configuration of a multichip module 1 according to an embodiment will be described with reference to FIG. 2A and FIG. 2B. FIG. 2A is a top view showing a configuration example of a multichip module 1 according to an embodiment. FIG. 2B is a schematic cross-sectional view by section line A-A showing a configuration example of the multichip module 1 in FIG. 2A. It should be noted that hatchings are omitted in FIG. 2B for a better visibility.

The multichip module 1 shown in FIG. 2A and FIG. 2B is provided with a first semiconductor chip 10A, a second semiconductor chip 10B, a first silicon substrate 20A, a second silicon substrate 20B and a third silicon substrate 20C. In the following, in case of not distinguishing the first semiconductor chip 10A and the second semiconductor chip 10B, they may be simply referred to as a semiconductor chip 10. Similarly, in case of not distinguishing the first silicon substrate 20A, the second silicon substrate 20B and the third silicon substrate 20C, they may be simply referred to as a silicon substrate 20. A silicon substrate 20 may be substituted to a substrate configured of materials other than silicon. In other words, although a "silicon substrate 20" is so called for convenience in the present embodiment, this is a mere example and there is no limitation to a substrate made of silicon.

The first semiconductor chip 10A according to an embodiment has a first surface and a second surface opposed to the first surface. A signal electrode 150A is formed on the first surface of the first semiconductor chip 10A. A ground electrode 110A is formed on the second surface of the first semiconductor chip 10A. Similarly, a signal electrode 150B is formed on a first surface of the second semiconductor chip 10B. A ground electrode 110B is formed on a second surface of the second semiconductor chip 10B. In the following, in case of not distinguishing the signal electrode 150A and the signal electrode 150B, they may be simply referred to as a signal electrode 150. In addition, in case of not distinguishing the ground electrode 110A and the ground electrode 110B, they may be simply referred to as a ground electrode 110. The signal electrode 150 may be electrically connected to the metal layer 15, the first diffusion layer 131 of the second diffusion layer 132 shown in FIG. 1 and may also be integrated to the metal layer 15. The ground electrode 110 may be electrically connected to the first substrate 11 shown in FIG. 1 and may also be integrated to the first substrate 11.

The first silicon substrate 20A according to an embodiment has a first mounting surface, a second mounting surface opposed to the first mounting surface and a conductive via 22A that penetrates between those mounting surfaces. A signal wiring 24A to electrically connect the signal electrode 150 of the semiconductor 10 thereto and a bonding terminal 231A connected to an end of the conductive via 22A are formed on the first mounting surface of the first silicon substrate 20A. In addition, a ground wiring 25A to electrically connect the ground electrode 110 of the semiconductor chip 10 and a bonding terminal 232A connected to another end of the conductive via 22A are formed on the second mounting surface of the first silicon substrate 20A. It should be noted that the ground wiring 25A may be omitted in case of not mounting the semiconductor 10 on the second mounting surface of the first silicon substrate 20A.

The second silicon substrate 20B according to an embodiment can be obtained by adding partial modifications to the first silicon substrate 20A. That is, the second silicon substrate 20B has a first mounting surface, a second mounting surface opposed to the first mounting surface, a conductive via 22B that penetrates between those mounting surfaces, a space for not interfering with the semiconductor chip 10 and an inner side surface 26B that faces this space. A bonding terminal 231B connected to an end of the conductive via 22B is formed on the first mounting surface of the second silicon substrate 20B. In addition, a bonding terminal 232B connected to another end of the conductive via 22B is formed on the second mounting surface of the second silicon substrate 20B. The space and the inner side surface 26B that the second silicon substrate 20B has will be described below.

The third silicon substrate 20C according to an embodiment is configured similarly to the first silicon substrate 20A. That is, the third silicon substrate 20C has a first mounting surface, a second mounting surface opposed to the first mounting surface and a conductive via 22C that penetrates between those mounting surfaces. A signal wiring 24C to electrically connect a signal electrode 150 of a semiconductor 10 thereto and a bonding terminal 231C connected to an end of the conductive via 22C are formed on the first mounting surface of the third silicon substrate 20C. In addition, a ground wiring 25C to electrically connect a ground electrode 110 of a semiconductor chip 10 thereto and a bonding terminal 232C connected to another end of the conductive via 22C are formed on the second mounting surface of the third silicon substrate 20C. It should be noted that the signal wiring 24C may be omitted in case of not mounting a semiconductor 10 on the first mounting surface of the third silicon substrate 20C.

In the following, in case of not distinguishing the conductive vias 22A to 22C, they may be simply referred to as a conductive via 22. In case of not distinguishing the bonding terminals 231A to 231C, they may be simply referred to as a bonding terminal 231. In case of not distinguishing the bonding terminals 232A to 232C, they may be simply referred to as a bonding terminal 232. In case of not distinguishing the signal wirings 24A and 24C, they may be simply referred to as a signal wiring 24. In case of not distinguishing the ground wirings 25A and 25C, they may be simply referred to as a ground wiring 25.

Connection relationship between the first semiconductor chip 10A, the second semiconductor chip 10B, the first silicon substrate 20A, the second silicon substrate 20B and the third silicon substrate 20C will be described.

The first semiconductor chip 10A is mounted on the first mounting surface of the first silicon substrate 20A. More specifically, the signal electrode 150A of the first semiconductor chip 10A is connected to the signal wiring 24A of the first silicon substrate 20A via a bump 31A. In other words, the first surface of the first semiconductor chip 10A on which the signal electrode 150A is formed and the first mounting surface of the first silicon substrate 20A on which the signal wiring 24A is formed are opposed to each other. Herein, a space between the first surface of the first semiconductor chip 10A and the first mounting surface of the first silicon substrate 20A is filled with an underfill 40.

As in the case of the first semiconductor chip 10A and the first silicon substrate 20A, the second semiconductor chip 10B is mounted on the third silicon substrate 20C. That is, the signal electrode 150B of the second semiconductor chip 10B is electrically connected to the signal wiring 24C of the third silicon substrate 20C via a bump 31B. In other words, the first surface of the second semiconductor substrate 10B on which the signal electrode 150B is formed and the first mounting surface of the third silicon substrate 20C on which the signal wiring 24C is formed are opposed to each other. A space between the first surface of the second semiconductor chip 10B and the first mounting surface of the third silicon substrate 20C is filled with an underfill 40.

In the following, in case of not distinguishing the bump 31A and the bump 31B, they will be simply referred to as a bump 31.

The second silicon substrate 20B is bonded between the first silicon substrate 20A and the third silicon substrate 20C. In other words, the first silicon substrate 20A, the second silicon substrate 20B and the third silicon substrate 20C are stacked in this order. More specifically, the bonding terminal 231A of the first silicon substrate 20A is bonded to the bonding terminal 232B of the second silicon substrate 20B and the bonding terminal 231B of the second silicon substrate 20B is bonded to the bonding terminal 232C of the third silicon substrate 20C. In further other words, the first mounting surface of the first silicon substrate 20A and the second mounting surface of the second silicon substrate 20B are opposed to each other, and the first mounting surface of the second silicon substrate 20B and the second mounting surface of the third silicon substrate 20C are opposed to each other.

An assembly of the bonding terminal 231 and the bonding terminal 232 that are bonded between two silicon substrates 20 will be also referred to as bonding section 23.

The first semiconductor chip 10A is mounted on the third silicon substrate 20C too. More specifically, the ground electrode 110A formed on the second surface of the first semiconductor chip 10A is electrically connected to the ground wiring 25C formed on the second mounting surface of the third silicon substrate 20C via a bump 32A.

It will be described that a thickness of the second silicon substrate 20B is determined based on a thickness of the first semiconductor chip 10A. In other words, a first thickness that is a thickness of the second silicon substrate 20B added with thicknesses of the bonding terminal 231B and the bonding terminal 232B of the second silicon substrate 20B is equal to a second thickness that is a thickness of the first semiconductor chip 10A added with a thickness of the signal electrode 150A and thicknesses of the bump 31A and the bump 32A.

In the first silicon substrate 20A, a thickness of the signal wiring 24A and a thickness of the bonding terminal 231A are equal. This is because the signal wiring 24A and the bonding terminal 231A are generated at a same time, by etching a same metal layer that is deposited at once, as described below. Similarly, in the third silicon substrate 20C, a thickness of the ground wiring 25C and a thickness of the bonding terminal 232C are equal.

Therefore, in a direction of stacking silicon substrates 20, a first distance from the bonding terminal 231A of the first silicon substrate 20A to the bonding terminal 232C of the third silicon substrate 20C is equal to a second distance from the signal wiring 24A of the first silicon substrate 20A to the ground wiring 25C of the third silicon substrate 20C.

Herein, the first distance is equal to the first thickness and the second distance is equal to the second thickness. However, it is preferable that thicknesses of the bumps 31 and 32A are larger at a stage before carrying out a mounting of the first semiconductor chip 10A and a bonding of the third silicon substrate 20C, compared to a stage after carrying out this mounting and this bonding, as described below. In other words, the first semiconductor chip 10A is firmly fixed between the first silicon substrate 20A and the third silicon substrate 20C by deformations of the bumps 31 and 32A and shrinkages thereof in the direction of stacking the silicon substrates 20 during this mounting and this bonding. It is preferable to determine the thickness of the second silicon substrate 20B so as to satisfy such conditions. For example, the second silicon substrate 20B may be configured by stacking a plurality of substrates so as to have a desired thickness as a result. It should be noted that it is similarly for a silicon substrate 20 other than the second silicon substrate 20B.

The space in the second silicon substrate 20B and the inner side surface 26B will be described. The second silicon substrate 20B has a shape provided with a space inside so as to avoid physical interference with the first semiconductor chip 10A. In other words, the second silicon substrate 20B is configured to be arranged around the first semiconductor chip 10A. In further other words, the second silicon substrate 20B has an inner side surface 26B configured to surround the first semiconductor chip 10A in a horizontal direction that is perpendicular to the stacking direction, in which substrates from the first silicon substrate 20A to the third silicon substrate 20C are stacked, and parallel to each mounting surface. Herein, it is preferable that the second silicon substrate 20B is provided with a plurality of conductive vias 22B and that this plurality of conductive vias 22B are arranged so as to surround the inner side surface 26B. In other words, it is preferable that the plurality of conductive vias 22B are arranged so as to surround the first semiconductor chip 10A.

Figure 2C:
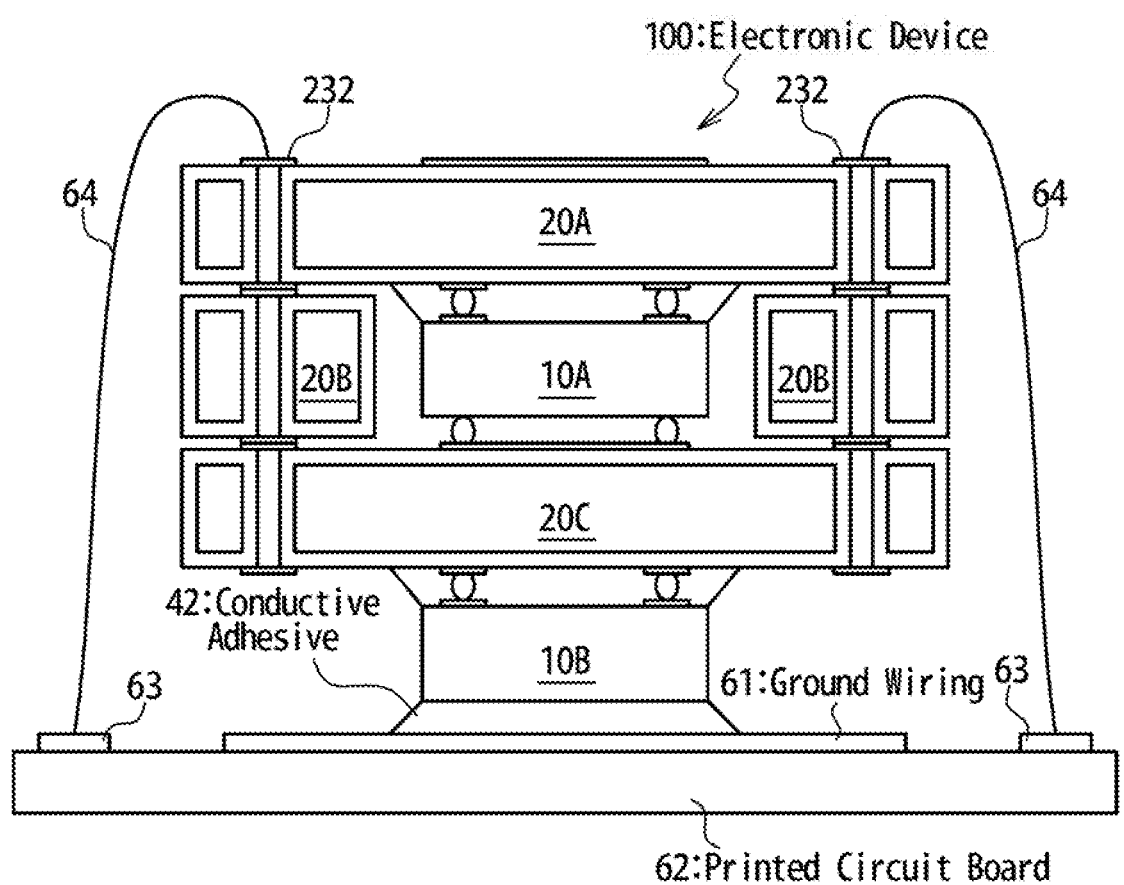
FIG. 2C is a schematic cross-sectional view showing a configuration example of an electronic device provided with a multichip module according to an embodiment.

An electronic device 100 in which the multichip module 1 in FIG. 2B is mounted on an external printed circuit board 62 will be described with reference to FIG. 2C. FIG. 2C is a schematic cross-sectional view showing a configuration example of an electronic device 100 provided with a multichip module 1 according to an embodiment. It should be noted that hatchings are omitted in FIG. 2C for a better visibility. The electronic device 100 in FIG. 2C is provided with a printed circuit board 62 and the multichip module 1 in FIG. 2B. The multichip module 1 is mounted on a mounting surface of the printed circuit board 62. A ground wiring 61 and a signal wiring 63 are formed on the mounting surface of the printed circuit board 62. The second semiconductor chip 10B of the multichip module 1 is mounted on the ground wiring 61. The ground electrode 110B of the second semiconductor chip 10B and the ground wiring 61 are electrically connected via a conductive adhesive 42. Herein, The conductive adhesive 42 fixes the printed circuit board 62 and the multichip module 1. In addition, the bonding terminal 232 of the multichip module 1 is electrically connected to the signal wiring 63 via a bonding wire 64. It should be noted that an electrode pad for connection may be provided to a section of the signal wiring 63 that is directly connected to the bonding wire 64.

It is preferable that the electronic device 100 is provided with an arbitrary component in addition to the printed circuit board 62 and the multichip module 1. The electronic device 100 may be a computer including the semiconductor chip 10 provided to the multichip module 1, for example. At that time, the semiconductor chip 10 may be a processing device and may be a storage device.

Figure 3:
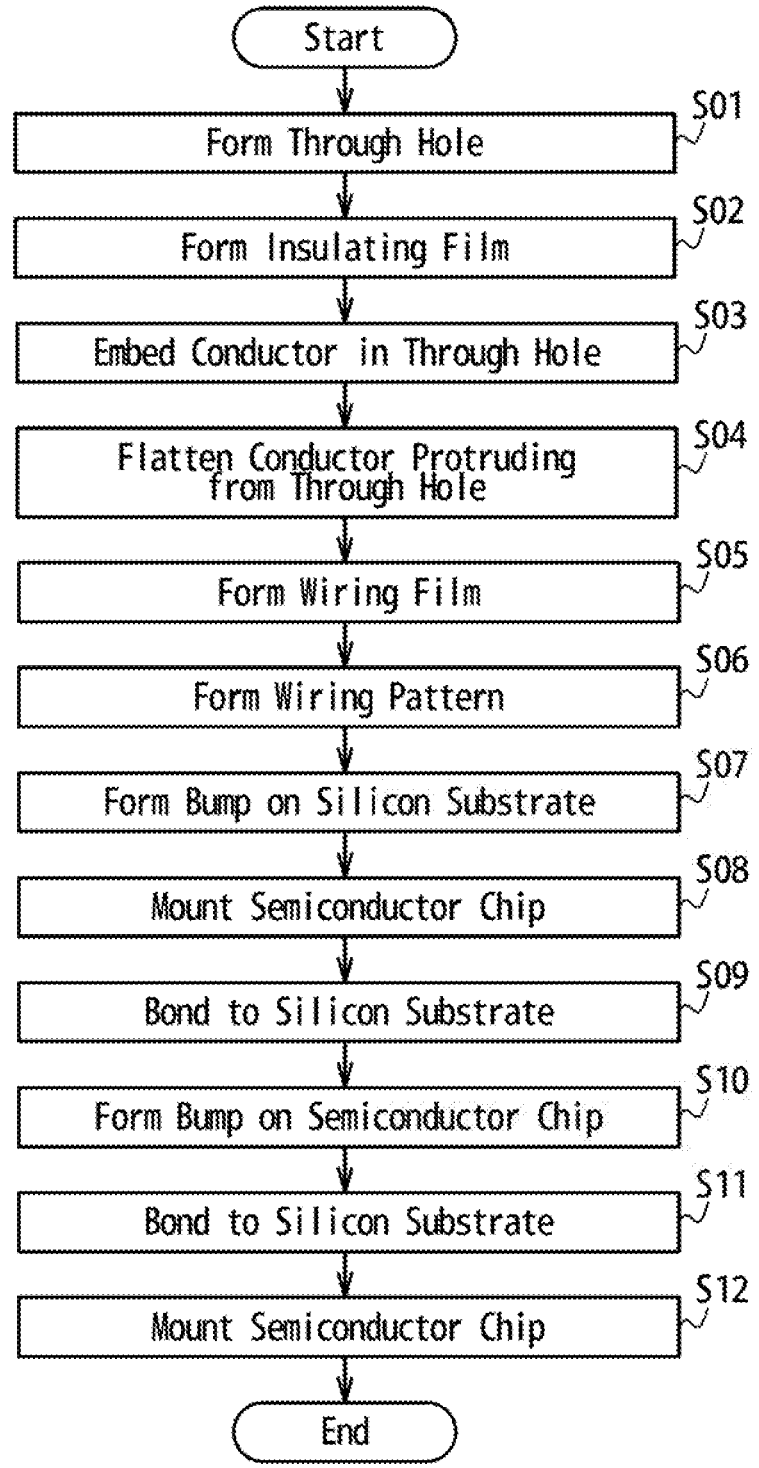
FIG. 3 is a flowchart showing a configuration example of a manufacturing method of a multichip module according to an embodiment.

A manufacturing method of a multichip module 1 according to an embodiment will be described with reference to FIG. 3 and FIGS. 4A to 4L. FIG. 3 is a flowchart showing a configuration example of a manufacturing method of a multichip module 1 according to an embodiment. FIGS. 4A to 4G are schematic cross-sectional views showing configuration examples of states during a manufacturing of a silicon substrate 20 according to an embodiment. FIGS. 4H to 4L are schematic cross-sectional views showing configuration examples of states during a manufacturing of a multichip module 1 according to an embodiment. It should be noted that difference of several materials constituting the silicon substrate 20 is shown by use of hatchings in FIGS. 4A to 4G while those hatchings are omitted in FIGS. 4H to 4L for a better visibility.

The flowchart in FIG. 3 includes a total of twelve steps from a first step S01 to a twelfth step S12. In the steps from the first step S01 to the sixth step S06, silicon substrates 20 are manufactured. In the following steps from the seventh step S07 to the twelfth step S12, the silicon substrates 20 are stacked and a multichip module 1 is manufactured. When the flowchart in FIG. 3 starts, the first step S01 is executed.

Figure 4A:
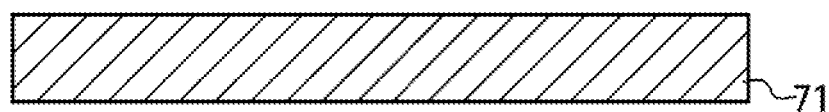
FIG. 4A is a schematic cross-sectional view showing a configuration example of a state of a silicon substrate according to an embodiment during manufacturing.
Figure 4B:
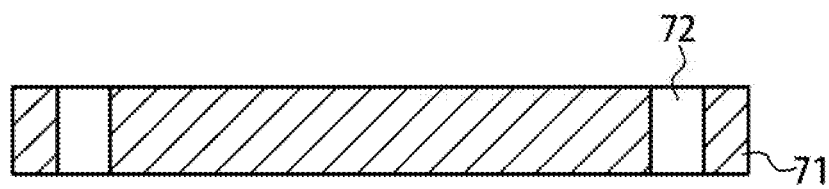
FIG. 4B is a schematic cross-sectional view showing a configuration example of a state of a silicon substrate according to an embodiment during manufacturing.

In the first step S01, a through hole 72 is formed in a silicon substrate 71. FIG. 4A shows a cross-sectional view of the silicon substrate 71 before the through hole 72 is formed. FIG. 4B shows a cross-sectional view of the silicon substrate 71 after the through hole 72 is formed. A formation of the through hole 72 is carried out by a method called Deep Reactive Ion Etching (RIE), for example. The through hole 72 penetrates between a first surface of the silicon substrate 71 and a second surface thereof opposed to the first surface. It is preferable that the through hole 72 is parallel to a thickness direction of the silicon substrate 71. The second step S02 is executed next to the first step S01.

Figure 4C:
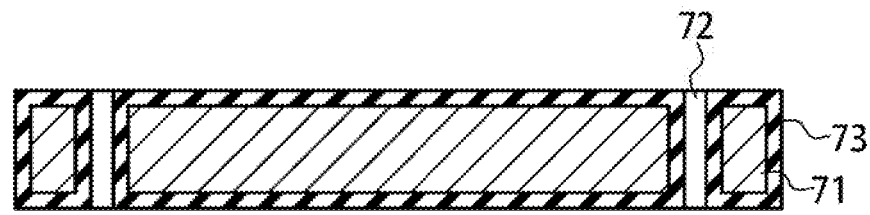
FIG. 4C is a schematic cross-sectional view showing a configuration example of a state of a silicon substrate according to an embodiment during manufacturing.

In the second step S02, an insulating film 73 is formed on a surface of the silicon substrate 71. FIG. 4C shows a cross-sectional view of the silicon 71 on which an insulating film 73 is formed. The insulating film 73 may consist of silicon oxide that is an oxidized surface of the silicon substrate 71, for example. Herein, the surface on which the insulating film 73 is formed includes the first surface, the second surface and other side surfaces of the silicon substrate 71 and also the inner side surface of the through hole 72 in addition. The third step S03 is executed next to the second step S02.

Figure 4D:
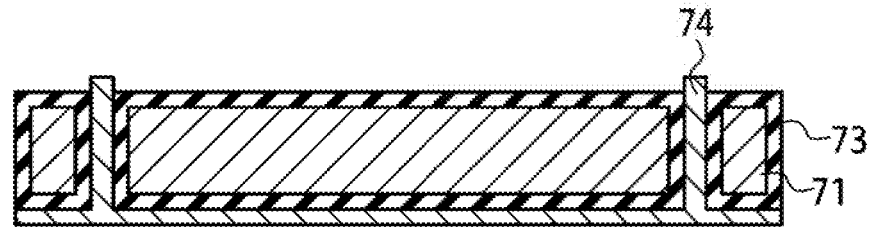
FIG. 4D is a schematic cross-sectional view showing a configuration example of a state of a silicon substrate according to an embodiment during manufacturing.

In the third step S03, a conductor 74 is embedded in the through hole 72. FIG. 4D shows a cross-sectional view of the silicon substrate 71 with a conductor 74 embedded in the through hole 72. Embedding of the conductor 74 is carried out by a method of copper plating for example. At that time, it is preferable that an inside of the through hole 72 is completely filled with the conductor 74. Therefore, the conductor 74 may be adhered not only to inside the through hole 72 but also to a surface of the silicon substrate 71 and may also protrude through the through hole 72 toward another surface of the silicon substrate 71. The fourth step S04 is executed next to the third step S03.

Figure 4E:
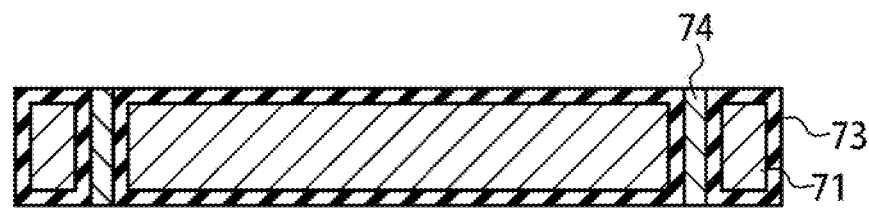
FIG. 4E is a schematic cross-sectional view showing a configuration example of a state of a silicon substrate according to an embodiment during manufacturing.

In the fourth step S04, the conductor 74 protruded from the through hole 72 is flattened. FIG. 4E shows a cross-sectional view of the silicon substrate 71 of which the conductor 74 protruded from the through hole 72 is flattened. Flattening is carried out by a method called Chemical Mechanical Polishing (CMP) process, for example. As a result, the conductor 74 adhered on the second surface of the silicon substrate 71 is removed and the insulating film 73 formed on the second surface of the silicon substrate 71 is exposed. In addition, the surface of the conductor 74 becomes flush with the insulating film 73 in both surfaces of the silicon substrate 71. The fifth step S05 is executed next to the fourth step S04.

Figure 4F:
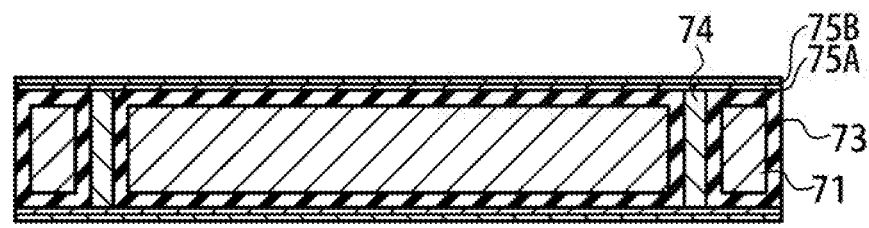
FIG. 4F is a schematic cross-sectional view showing a configuration example of a state of a silicon substrate according to an embodiment during manufacturing.

In the fifth step S05, wiring films 75A and 75B are formed on both surfaces of the silicon substrate 71. FIG. 4F shows a cross-sectional view of the silicon substrate 71 formed with wiring films 75A and 75B on both surfaces thereof. A first wiring film 75A and a second wiring film 75B consist of titanium and gold, respectively, for example. Forming of the wiring films 75A and 75B is carried out by vapor-depositing the first wiring film 75A of titanium on the first surface and the second surface of the insulating film 73 and further vapor-depositing the second wiring film 75B of gold on a surface of the first wiring film 75A, for example. The sixth step S06 is executed next to the fifth step S05.

Figure 4G:
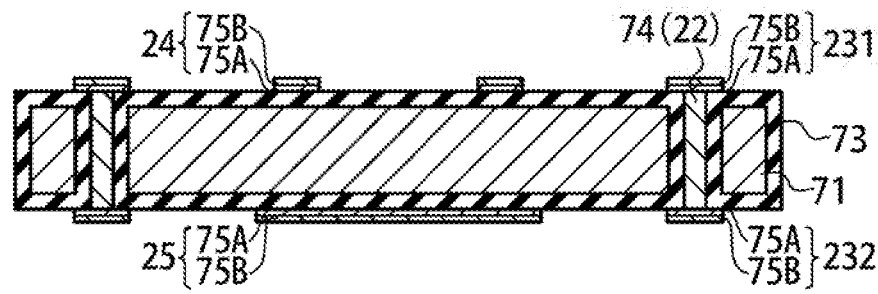
FIG. 4G is a schematic cross-sectional view showing a configuration example of a state of a silicon substrate according to an embodiment during manufacturing.

In the sixth step S06, wiring patterns are formed on both surfaces of the silicon substrate 71. FIG. 4G shows cross-sectional view of the silicon substrate 71 formed with wiring patterns on both surfaces thereof. Forming of the wiring patterns is carried out by wiring patterning including masking by exposure and etching, for example. As a result, signal wirings 24 and bonding terminals 231 are formed on the first surface of the silicon substrate 71, and ground wirings 25 and bonding terminals 232 are formed on the second surface of the silicon substrate 71.

When the steps from the first step S01 to the sixth step S06 are completed, the first silicon substrate 20A shown in FIG. 2B is completed. Similarly, the third silicon substrate 20C can be completed by the steps from the first step S01 to the sixth step S06. A manufacturing method of the second silicon substrate 20B will be described below. The seventh step S07 is executed next to the sixth step S06.

Figure 4H:
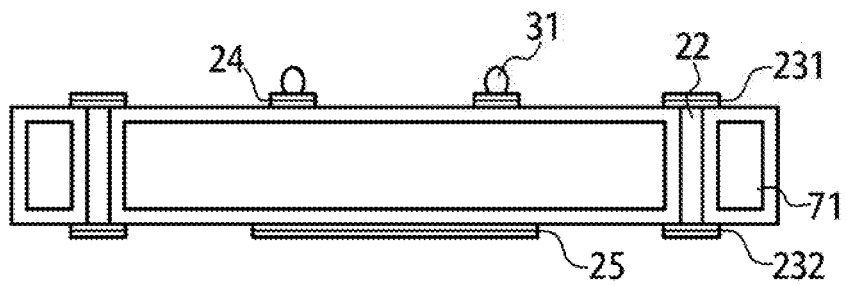
FIG. 4H is a schematic cross-sectional view showing a configuration example of a state of a multichip module according to an embodiment during manufacturing.

In the seventh step S07, a bump 31 is formed on the silicon substrate 71. FIG. 4H shows a cross-sectional view of the silicon substrate 71 with a bump 31 formed on a surface of the signal wiring 24. The silicon substrate 71 shown in FIG. 4H corresponds to the first silicon substrate 20A and the third silicon substrate 20C shown in FIG. 2B, for example. It is preferable that the bump 31 consists of a metal having elasticity. More specifically, the bump 31 is a gold bump. Although a golden bump may be formed by use of 4N gold wire of which gold content is 99.99% by weight or more and 100% by weight or less, for example, the present embodiment is not limited by this example. A formation of the bump 31 may be carried out by room temperature bonding between gold wiring film 75B formed on the surface of the signal wiring 24 and the gold bump 31, for example.

It should be noted that the silicon substrate 71 shown in FIG. 4H may correspond to both of the first silicon substrate 20A and the third silicon substrate 20C shown in FIG. 2B. The eighth step S08 is executed next to the seventh step S07.

Figure 4I:
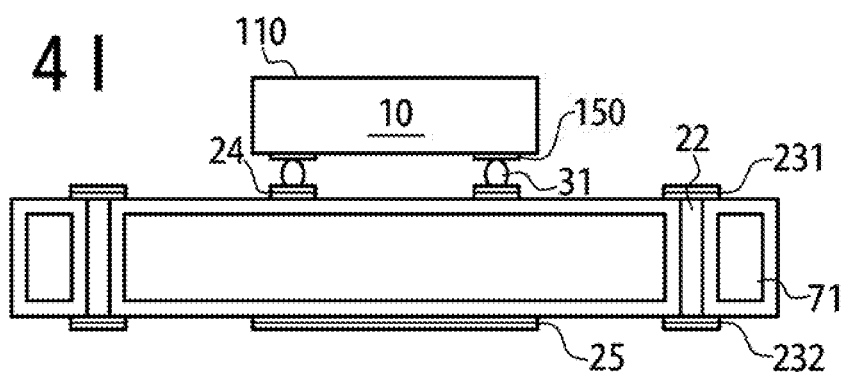
FIG. 4I is a schematic cross-sectional view showing a configuration example of a state of a multichip module according to an embodiment during manufacturing.

In the eighth step S08, the semiconductor chip 10 is mounted on the silicon substrate 71. FIG. 4I shows a cross-sectional view of the silicon substrate 71 on which the silicon substrate 10 is mounted. Herein, the signal electrode 150 of the semiconductor chip 10 is connected to the signal wiring 24 via the bump 31. In other words, the semiconductor chip 10 is flip-chip-mounted on the silicon substrate 71. A combination of the silicon substrate 71 and the semiconductor chip 10 shown in FIG. 4I corresponds to a combination of the first silicon substrate 20A and the first semiconductor chip 10A shown in FIG. 2B, and in addition corresponds to a combination of the third silicon substrate 20C and the second semiconductor chip 10B as well. If a material of the signal electrode 150 of the semiconductor 10 is gold, mounting of the semiconductor chip 10 on the silicon substrate 71 may be carried out by room temperature bonding between the gold signal electrode 150 and the gold bump 31, for example.

It should be noted that the silicon substrate 71 shown in FIG. 4I may correspond to both of the first silicon substrate 20A and the third silicon substrate 20C shown in FIG. 2B. In addition, the semiconductor chip 10 shown in FIG. 4I may correspond to both of the first semiconductor chip 10A and the second semiconductor chip 10B shown in FIG. 2. The ninth step S09 is executed next to the eighth step S08.

Figure 4J:
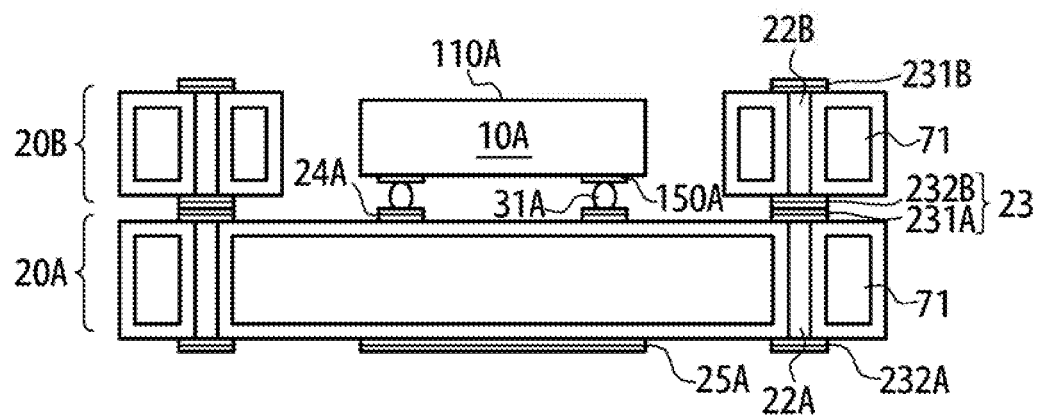
FIG. 4J is a schematic cross-sectional view showing a configuration example of a state of a multichip module according to an embodiment during manufacturing.

In the ninth step S09, another silicon substrate 71 is bonded on the silicon substrate 71. FIG. 4J shows a cross-sectional view of a silicon substrate 71 on which another silicon substrate 71 is bonded. The silicon substrate 71 shown in FIG. 4J corresponds to the first silicon substrate 20A shown in FIG. 2B and the other silicon substrate 71 corresponds to the second silicon substrate 20B shown in FIG. 2B.

A manufacturing method of the second silicon substrate 20B will be described with reference to FIG. 5. FIG. 5 is a perspective view showing a configuration example of the silicon substrate 71 in which a frame-shaped through hole 711 is formed. The second silicon substrate 20B is equivalent to the first silicon substrate 20A or the third silicon substrate 20C from which a part that may interfere with the semiconductor chip 10 is removed. This process of removing may be carried out by use of Deep RIE, for example, similarly to the case of the first step S01. That is, by forming the frame-shaped through hole 711 shown in FIG. 5 in the silicon substrate 71 shown in FIG. 4A by Deep RIE, an inner side section 712 of the silicon substrate 71 that is inside the through hole 711 can be separated from remaining part of the silicon substrate 71. The second silicon substrate 20B can be formed by executing the steps from the first step S01 to the sixth step S06 afterwards.

The second silicon substrate 20B formed as above is provided with a conductive via 22B, a bonding terminal 231B connected to an end of this conductive via 22B and a bonding terminal 232B connected to another end of the conductive via 22B, as shown in FIG. 2B. The bonding terminal 231A of the first silicon substrate 20A and the bonding terminal 232B of the second silicon substrate 20B are bonded in the tenth step S10 and form the bonding section 23. This bonding may be carried out by use of room temperature bonding between the gold wiring films 75B existing on surfaces of both the bonding terminal 231A and 232B. The tenth step S10 is executed next to the ninth step S09.

Figure 4K:
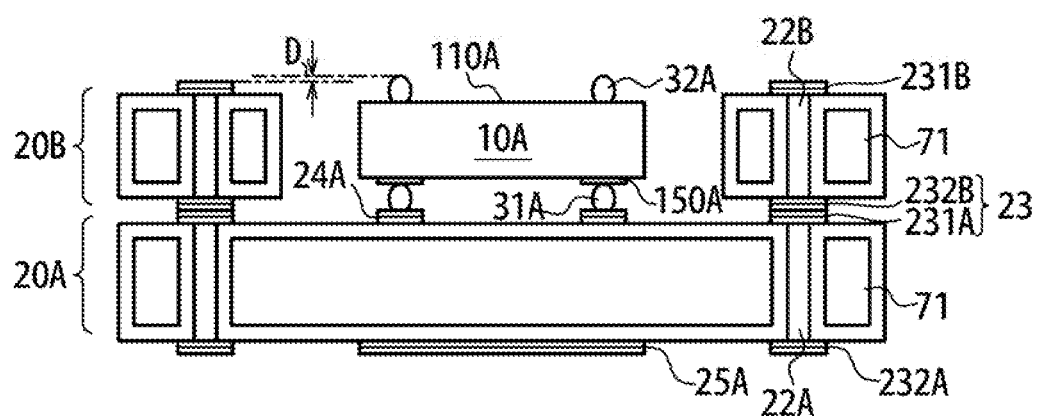
FIG. 4K is a schematic cross-sectional view showing a configuration example of a state of a multichip module according to an embodiment during manufacturing.

In the tenth step S10, a bump 32A is formed on the semiconductor chip 10 mounted on the silicon substrate 71. FIG. 4K shows a cross-sectional view of the silicon substrate 71 with the bump 32A formed on the mounted semiconductor chip 10. This bump 32A is formed on the second surface of the semiconductor chip 10 that is opposed to the first surface thereof that is opposed to the silicon substrate 71. More specifically, this bump 32A is formed so as to be connected to the ground electrode 110 of the semiconductor chip 10. It is preferable that the metal that consist the bump 32A also has elasticity, similarly to the metal that consists the bump 31. In other words, it is preferable that the bump 32A also is a gold bump. The bumps 32A may be formed by room temperature bonding, similarly to the case of the bump 31.

It should be noted that, when the tenth step S10 is completed, a distance from an arbitrary reference surface to an apex of the bump 32A is longer than a distance from the same arbitrary reference surface to an end surface of the bonding terminal 231 of the second silicon substrate 20B, in a direction of stacking silicon substrates 20. A difference of those distances is shown as a distance D in FIG. 4K. In addition, this reference surface is perpendicular to the stacking direction and may be any mounting surface of any silicon substrates 20 that are stacked, for example. The eleventh step S11 is executed next to the tenth step S10.

Figure 4L:
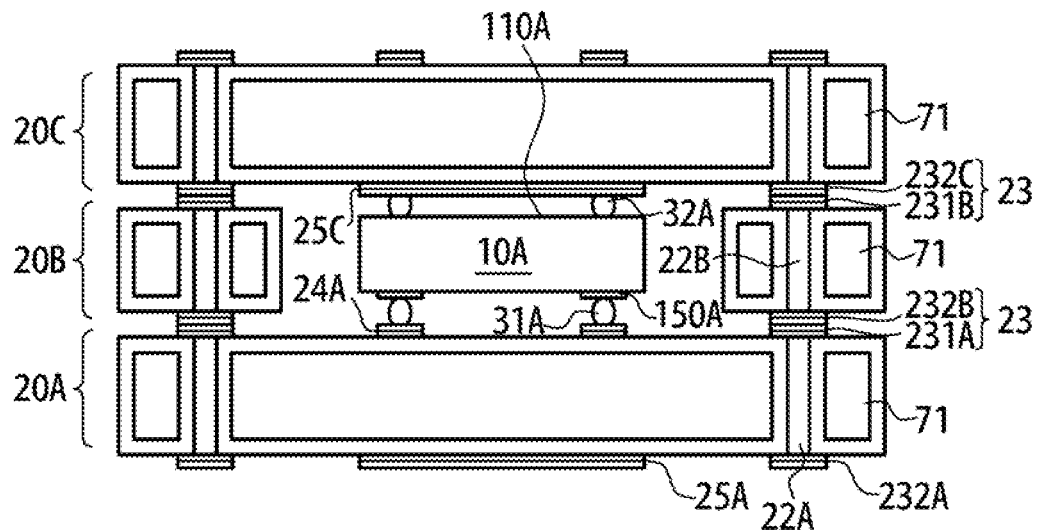
FIG. 4L is a schematic cross-sectional view showing a configuration example of a state of a multichip module according to an embodiment during manufacturing.

In the eleventh step S11, a further other silicon substrate 71 (20C) is bonded on the pair of silicon substrates 71 (20A and 20B) bonded in the tenth step S10. FIG. 4L shows a cross-sectional view of the three bonded silicon substrates 71 (20A, 20B and 20C). The third silicon substrate 20C shown in FIG. 2B corresponds to this further other substrate 71 (20C).

When the third silicon substrate 20C is bonded to the second silicon substrate 20B, the first semiconductor chip 10A is mounted to the second mounting surface of the third silicon substrate 20C at the same time. Herein, it is preferable that elasticity of the bump 32A is used so that both bonding and mounting are reliably carried out. In other words, the bump 32A is deformed so that its size is shrunk in the direction of stacking the silicon substrates 71 (20A, 20B and 20C) and consequently the bonding terminal 231B of the second silicon substrate 20B and the bonding terminal 232C of the third silicon substrate 20C are bonded to each other to become the bonding section 23. As a result, an electrical connection is guaranteed between the ground electrode 110A of the first semiconductor chip 10A and the ground wiring 25C of the third silicon substrate 20C. This mounting and this bonding may be carried out at the same time by use of room temperature bonding at once. The twelfth step S12 is executed next to the eleventh step S11.

In the twelfth step S12, the second semiconductor chip 10B is mounted on the third silicon substrate 20C. This mounting may be carried out similarly to the mounting of the first semiconductor chip 10A on the first silicon substrate 20A. When the twelfth step S12 is completed, the multichip module 1 shown in FIG. 2B is completed and the flowchart in FIG. 3 ends.

As a variation example of the third step S03 shown in the flowchart in FIG. 3, a formation of aluminum conductive film by spattering may be carried out instead of copper plating, for example. In this case, aluminum films are formed on both surfaces of the silicon substrate 71 and inner side surface of the through hole 72, by a method called spattering. In addition, in this case, bonding surfaces may be polished by CMP process after carrying out wiring patterning of the sixth step S06 shown in the flowchart in FIG. 3. It should be noted that room temperature bonding can be carried out between aluminum bonding terminals 231 and 232.

As a variation example of the fifth step SOS shown in the flowchart in FIG. 3, a nickel wiring film may be further formed between the titanium wiring film 75A and the gold wiring film 75B shown in FIG. 4F. In other words, a step of vapor-depositing a nickel wiring film may be added after vapor-depositing the first wiring film 75A of titanium and before vapor-depositing the second wiring film 75B of gold. Soldering of circuit devices or the like on wiring can be carried out more easily by adding a wiring film of nickel.

As a variation example of the flowchart in FIG. 3, an order to execute the ninth step S09 and the tenth step S10 may be reversed. In other words, the second silicon substrate 20B may be bonded to the first silicon substrate 20A that is mounted with the first semiconductor chip 10A after the bump 32A is formed on the ground electrode 110A of the first semiconductor chip 10A. However, in this case, a jig provided with a recess at a position corresponding to the bump 32A may be required so that the bump 32A that is already formed does not touch a plane plate of a bonding apparatus when bonding the silicon substrates 20A and 20B. In addition, an order to execute the eleventh step S11 and the twelfth step S12 may be reversed. In other words, the third silicon substrate 20C may be bonded to the second silicon substrate 20B after the second semiconductor chip 10B is mounted on the third silicon substrate 20C. As a further variation example, the second semiconductor chip 10B may be mounted on the third silicon substrate 20C at first, then the first semiconductor chip 10A may be mounted on the first silicon substrate 20A, then the bump 32A may be formed on the first semiconductor chip 10A, then the second silicon substrate 20B and the third silicon substrate 20C may be bonded, and finally the first silicon substrate 20A and the second silicon substrate 20B may be bonded. As above, an order of executing each step for manufacturing a desired multichip module 1 shown in FIG. 2B for example may be freely changed within a scope of not technically contradicting and is not limited by examples shown in the present embodiment.

As described above, in the multichip module 1 according to the present embodiment, the first semiconductor chip 10A is mounted by a surface thereof on the first silicon substrate 20A and is mounted by another surface thereof on the third silicon substrate 20C. Furthermore, the second silicon substrate 20B is bonded between the first silicon substrate 20A and the third silicon substrate 20C. By doing so, the back surface of the semiconductor chip 10A, that is opposed to the front-surface on which the signal electrode 105 is formed, can be electrically grounded even if the first semiconductor chip 10A arranged inside the multichip module 1 is a SOI.

Furthermore, by connecting both surfaces of the first semiconductor chip 10A to two substrates 20A and 20C, respectively, the first semiconductor chip 10A is more firmly fixed to the multichip module 1, compared to a case in which only one surface of the first semiconductor chip 10A is connected to the first silicon substrate 20A. This improves stability of operation of the multichip module 1.

Second Embodiment

A multichip module 1 according to the present embodiment is equivalent to the multichip module 1 shown in FIG. 2B or the like added with seal rings 233 and 234. The seal rings 233 and 234 are arranged between each silicon substrates. Specifically, the seal rings 233 and 234 are arranged between the first silicon substrate 20A and the second silicon substrate 20B, and between the second silicon substrate 20B and the third silicon substrate 20C. By doing so, an inner space inside the stacked substrates from the first silicon substrate 20A to the third silicon substrate 20C will be sealed airtightly. In other words, this inner space will be less susceptible to influences from outside the multichip module 1. As a result, a stability of operations of the first semiconductor chip 10A arranged in this inner space improves.

Figure 6A:
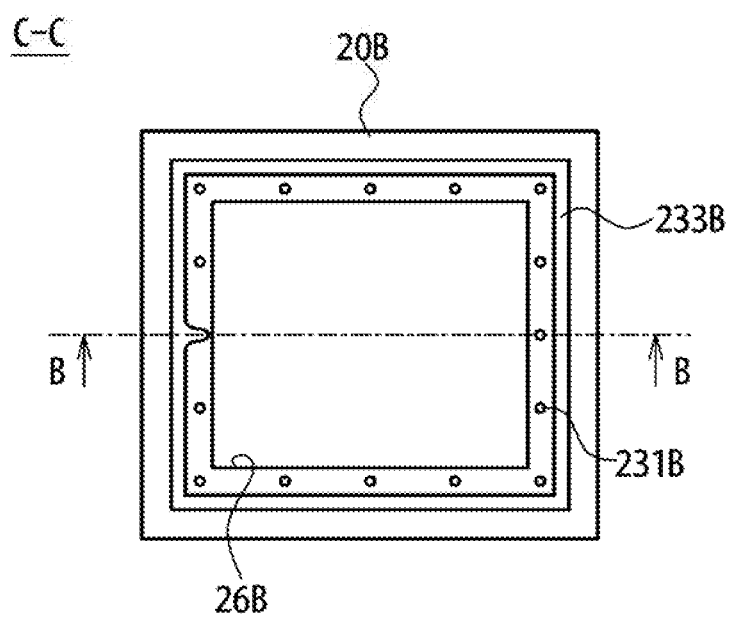
FIG. 6A is a schematic cross-sectional view by section line C-C of a multichip module according to an embodiment.
Figure 6B:
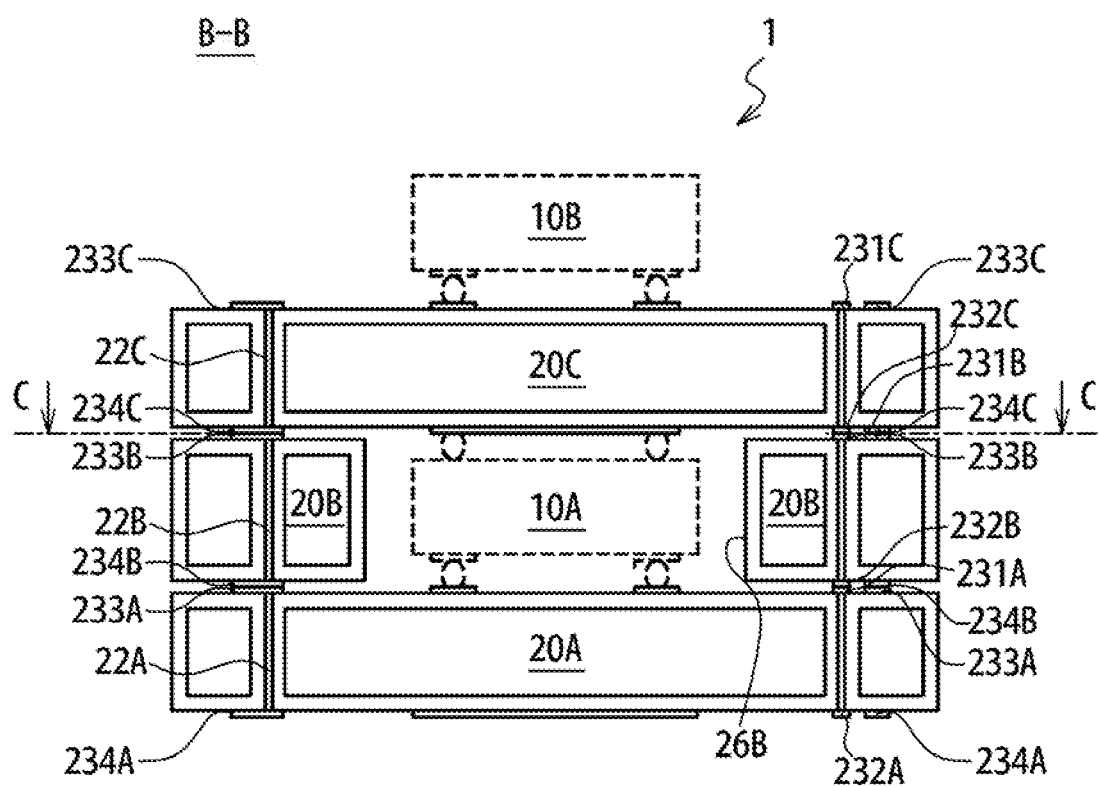
FIG. 6B is a schematic cross-sectional view by section line B-B of a multichip module according to an embodiment.

A configuration of the multichip module 1 according to the present embodiment will be described with reference to FIG. 6A and FIG. 6B. FIG. 6A is a schematic cross-sectional view of the multichip module 1 according to an embodiment, by a section line C-C. FIG. 6B is a schematic cross-sectional view of the multichip module 1 according to an embodiment, by a section line B-B. It should be noted that in FIG. 6A and FIG. 6B hatchings are omitted for a better visibility.

FIG. 6A shows the first mounting surface of the second silicon substrate 20B and components provided to this first mounting surface. In other words, the section line C-C matches a bonding surface between the second silicon substrate 20B and the third silicon substrate 20C, as shown in FIG. 6B. However, in FIG. 6A, the first semiconductor chip 10A and the bump 32A are not shown.

The second silicon substrate 20B shown in FIG. 6A is provided with the seal ring 233B, in addition to the conductive via 22B, the bonding terminal 231B and the inner side surface 26B that the second silicon substrate 20B in FIG. 2B has. The plurality of bonding terminals 231B that the second silicon substrate 20B has is arranged in the first mounting surface so as to surround the inner space that is surrounded by the inner side surface 26B. The seal ring 233B is arranged in the first mounting surface and is arranged around this plurality of bonding terminals 231B. However, the seal ring 233B shown in FIG. 6A is integrated to one among the bonding terminals 231B shown in FIG. 2B. It is preferable that the seal ring 233B is grounded via the integrated bonding terminal 231B for example.

FIG. 6B is same as the schematic cross-sectional view of the multichip module 1 shown in FIG. 2B added with seal rings 233A, 233B, 233C, 234A, 234B and 234C. In other words, the section line B-B passes by the bonding terminal 231B integrated to the seal ring 233B and another bonding terminal 231B independent from the seal ring 233B, as shown in FIG. 6A. It should be noted that the first semiconductor chip 10A, the second semiconductor 10B, the signal electrodes 150, the ground electrode 110, the bumps 31 and the bumps 32A are shown by broken lines in FIG. 6B.

In case of not distinguishing the seal rings 233A, 233B and 233C, they will be simply referred to as a seal ring 233. In case of not distinguishing the seal rings 234A, 234B and 234C, they will be simply referred to as a seal ring 234.

The seal ring 233A is formed on the first mounting surface of the first silicon substrate 20A that is to be bonded to the second silicon substrate 20B. The seal ring 234A is formed on the second mounting surface of the first silicon substrate 20A. In case of not bonding other silicon substrate 20 on the second mounting surface of the first silicon substrate 20A, the seal ring 234A can be omitted.

The seal ring 233B is formed on the first mounting surface of the second silicon substrate 20B that is to be bonded to the third silicon substrate 20C. The seal ring 234B is formed on the second mounting surface of the second silicon substrate 20B that is to be bonded on the first silicon substrate 20A.

The seal ring 233C is formed on the first mounting surface of the third silicon substrate 20C. The seal ring 234C is formed on the second mounting surface of the third silicon substrate 20C that is to be bonded to the second silicon substrate 20B. In case of not bonding other silicon substrate 20 on the first mounting surface of the third silicon substrate 20C, the seal ring 233C can be omitted.

The seal rings 233 and 234 are formed as parts of wiring patterns formed in the sixth step S06 shown in the flowchart in FIG. 3.

The seal ring 233A formed on the first mounting surface of the first silicon substrate 20A and the seal ring 234B formed on the second mounting surface of the second silicon substrate 20B are bonded to each other in the tenth step S10 shown in the flowchart in FIG. 3. In other words, the bonding between the seal ring 233A of the first silicon substrate 20A and the seal ring 234B of the second silicon substrate 20B is carried out at the same time of bonding the bonding terminal 231A of the first silicon substrate 20A and the bonding terminal 232B of the second silicon substrate 20B.

The seal ring 233B formed on the first mounting surface of the second silicon substrate 20B and the seal ring 234C formed on the second mounting surface of the third silicon substrate 20C are bonded in the eleventh step S11 shown in the flowchart in FIG. 3. In other words, the bonding between the seal ring 233B of the second silicon substrate 20B and the seal ring 234C of the third silicon substrate 20C is carried out at the same time of bonding the bonding terminal 231B of the second silicon substrate 20B and the bonding terminal 232C of the third silicon substrate 20C.

Components and steps of the configuration and manufacturing method of the multichip module 1 according to the present embodiment other than the ones described above are similar to the case of the first embodiment and therefore further detailed description are omitted.

As described above, a gap between stacked substrates from the first silicon substrate 20A to the third silicon substrate 20C is sealed by seal rings 233 and 234 in the multichip module 1 according to the present embodiment. Herein, if the bonding of the substrates of the first silicon substrate 20A to the third silicon substrate 20C is carried out by room temperature bonding, the space where the first semiconductor chip 10A is arranged is in a substantially vacuum state. This is because room temperature bonding is generally carried out in a chamber in a substantially vacuum state. And, the space where the first semiconductor chip 10A is arranged is kept in a substantially vacuum state after the multichip module 1 is completed because of airtightness of the seal rings 233 and 234. This improves stability of operations of the first semiconductor chip 10A. In addition, room temperature bonding has an excellent feature in that thermal distortions do not occur or hardly occur in the substrates from the first silicon substrate 20A to the third silicon substrate 20C after being bonded, compared to other bonding methods. However, the room temperature bonding is merely an example and does not limit the method of bonding silicon substrates 20 thereto.

Although the invention made by the inventor has been described above based on embodiments in detail, it is needless to assert that the present invention is not limited by the above described embodiments and that various modifications can be made without departing from the gist thereof. In addition, each of features described in the above described embodiments can be freely combined within a scope of not technically contradicting.

DESCRIPTION OF SYMBOLS

1 Multichip module
10, 10A, 10B Semiconductor chip
11 Substrate
110, 110A, 110B Ground electrode
12 Insulating layer
13 Substrate
131 Diffusion layer
132 Diffusion layer
14 Insulating film
5 Metal layer
150, 150A, 150B Signal electrode
20, 20A, 20B, 20C Silicon substrate
22, 22A, 22B, 22C Conductive via
23 Bonding section
231A, 231B, 231C Bonding terminal
232A, 232B, 232C Bonding terminal
233A, 233B, 233C Seal ring
234A, 234B, 234C Seal ring
24, 24A, 24C Signal wiring
25, 25A, 25C Ground wiring
26B Inner side surface
31A, 31B Bump
32A Bump
40 Underfill
42 Conductive adhesive
60 Ground
61 Ground wiring
62 Printed circuit board
63 Signal wiring
64 Bonding wire
71 Silicon substrate
711 Through hole
712 Inner side section
72 Through hole
73 Insulating film
74 Conductor
75A, 75B Wiring film
100 Electronic device
D Distance

The invention claimed is:

1. A multichip module comprising:
a first substrate having a first mounting surface provided with a first wiring;
a first semiconductor chip having a first surface provided with a first electrode and a second surface opposed to the first surface, mounted on the first substrate so that the first wiring and the first electrode are electrically connected;

a second substrate having a second mounting surface and a third mounting surface opposed to the second mounting surface, bonded to the first substrate so that the second mounting surface is opposed to the first mounting surface;

a third substrate having a fourth mounting surface provided with a second wiring and a fifth mounting surface opposed to the fourth mounting surface, bonded to the second substrate so that the fourth mounting surface is opposed to the third mounting surface and mounted with the first semiconductor chip so that the second wiring is electrically connected to the second surface and an electric potential of the second surface stabilizes; and a second semiconductor chip having a third surface and mounted on the third substrate so that the third surface is opposed to the fifth mounting surface.

2. The multichip module according to claim 1, further comprising:

a first bump configured to electrically connect the first electrode to the first wiring; and a second bump configured to electrically connect the second surface to the second wiring.

3. The multichip module according to claim 1, wherein the first substrate further comprises a first bonding terminal provided on the first mounting surface, wherein the second substrate further comprises:

a conductive via configured to penetrate between the second mounting surface and the third mounting surface;

a second bonding terminal provided on the second mounting surface, connected to an end of the conductive via and bonded to the first bonding terminal; and a third bonding terminal provided on the third mounting surface and connected to another end of the conductive via, wherein the third substrate further comprises a fourth bonding terminal provided on the fourth mounting surface and bonded to the third bonding terminal, and wherein a first distance from the first bonding terminal to the fourth bonding terminal is equal to a second distance from the first wiring to the second wiring in a stacking direction in which the first substrate, the second substrate and the third substrate are stacked.

4. The multichip module according to claim 3, wherein the second substrate further comprises an inner side surface that faces an inner space configured to avoid physical interference with the first semiconductor chip.

5. The multichip module according to claim 4, further comprising:

a first seal ring configured to airtightly seal between the first mounting surface of the first substrate and a second mounting surface of the second substrate and arranged to surround the inner side surface in directions perpendicular to the stacking direction; and a second seal ring configured to airtightly seal between the third mounting surface of the second substrate and the fourth mounting surface of the third substrate and arranged to surround the inner side surface in directions perpendicular to the stacking direction.

6. The multichip module according to claim 1, wherein at least one among the first substrate, the second substrate and the third substrate comprises a silicon substrate.

7. The multichip module according to claim 1, wherein at least one among the first substrate, the second substrate and the third substrate comprises a plurality of stacked substrates.

8. An electronic device comprising:

a multichip module; and a substrate configured to mount the multichip module, wherein the multichip module comprises:

a first substrate having a first mounting surface provided with a first wiring;

a first semiconductor chip having a first surface provided with a first electrode and a second surface opposed to the first surface, mounted on the first substrate so that the first wiring and the first electrode are electrically connected;

a second substrate having a second mounting surface and a third mounting surface opposed to the second mounting surface, bonded to the first substrate so that the second mounting surface is opposed to the first mounting surface;

a third substrate having a fourth mounting surface provided with a second wiring and a fifth mounting surface opposed to the fourth mounting surface, bonded to the second substrate so that the fourth mounting surface is opposed to the third mounting surface and mounted with the first semiconductor chip so that the second wiring is electrically connected to the second surface and an electrical potential of the second surface stabilizes; and a second semiconductor chip having a third surface and mounted on the third substrate so that the third surface is opposed to the fifth mounting surface.

* * * * *